(12) United States Patent
Hsia et al.

(10) Patent No.: US 6,251,568 B1
(45) Date of Patent: Jun. 26, 2001

(54) METHODS AND APPARATUS FOR STRIPPING PHOTORESIST AND POLYMER LAYERS FROM A SEMICONDUCTOR STACK IN A NON-CORROSIVE ENVIRONMENT

(75) Inventors: Shao-Wen Hsia, Mission Viejo; Peter Y. Huang, South Coast Metro, both of CA (US)

(73) Assignee: Conexant Systems Inc., Newport Beach, CA (US)

( * ) Notice: Subject to any disclaimer, the term of this patent is extended or adjusted under 35 U.S.C. 154(b) by 0 days.

(21) Appl. No.: 09/247,234

(22) Filed: Feb. 9, 1999

(51) Int. Cl.$^7$ .................................................... G03F 7/36
(52) U.S. Cl. .................................. 430/325; 430/318
(58) Field of Search ..................... 430/318, 325

(56) References Cited

U.S. PATENT DOCUMENTS

| | | | |
|---|---|---|---|
| 5,174,856 | * | 12/1992 | Hwang et al. ............... 156/643 |
| 5,200,031 | * | 4/1993 | Latchford et al. ............... 156/659.1 |
| 5,533,635 | * | 7/1996 | Man ............................... 216/67 |
| 5,770,523 | * | 6/1998 | Hung et al. ..................... 438/725 |
| 5,976,986 | * | 11/1999 | Naeem et al. .................. 438/714 |
| 6,062,237 | * | 5/2000 | Brown et al. .................. 134/1.1 |
| 6,184,134 | * | 2/2001 | Chaudhary et al. ........... 438/669 |

* cited by examiner

*Primary Examiner*—Hoa Van Le
(74) *Attorney, Agent, or Firm*—Snell & Wilmer LLP

(57) ABSTRACT

The present invention relates to method and apparatus for removing photoresist material from a wafer surface. In particular, the present invention employs a dry strip process to remove photoresist material that remains after conductive material has been etched to form conductive features. The inventive process includes a reactive ion strip process that includes fluorine, which forms salts with conductive material embedded in the photoresist material. The salts are then removed from the wafer surface by dissolving them in a solvent such as deionized water.

9 Claims, 6 Drawing Sheets

METHODS AND APPARATUS FOR STRIPPING PHOTORESIST AND POLYMER LAYERS FROM A SEMICONDUCTOR STACK IN A NON-CORROSIVE ENVIRONMENT

BACKGROUND OF THE INVENTION

1. Technical Field

The present invention relates, generally, to techniques for removing photoresist and polymeric residue from a surface of a microelectronic structure following metal etching and, more particularly, to a dry strip technique for mitigating metal corrosion during the photoresist and polymeric residue removal.

2. Background Art and Technical Problems

Microelectronic devices are often manufactured as integrated circuits (also referred to as semiconductor interconnect devices) because the various "integrated" layers of the metal stack must be interconnected to one another to facilitate the conduction of electronic signals among the various layers in the device. As device density (i.e., the number of microelectronic structures per square area) increases, the size of the various features, often referred to as the line width or critical dimension (CD), must decrease to allow an increased pattern density on a given chip area. This pressure to conserve real estate on the chip has caused many unforeseen problems in the design and manufacture of high density, deep sub-micron interconnect structures.

In particular, presently known fabrication techniques typically involve applying a layer of a photoresist material on top of a metal stack, and then exposing predetermined regions of the photoresist layer by passing a predetermined wavelength or wavelengths of light through a mask. After the desired regions of the photoresist have been exposed, the photoresist layer is developed, leaving a predetermined pattern of photoresist structures on the metal surface. The process of exposing and developing the photoresist to create this predetermined pattern is often referred to as "printing" a photoresist pattern on the metal layer.

Having established the photoresist pattern, it is then necessary to transfer this pattern into the metal, such that the photoresist pattern is suitably identically replicated in the metal layer during a metal etching process; in other words, the metal is etched away over the entire surface of the metal layer except in those regions where the photoresist pattern remains. Consequently, a well-defined pattern of metallic microelectronic structures is created in the metal layer, wherein this metal pattern very closely approximates the aforementioned photoresist pattern.

Once the pattern of metallic microelectronic structures has been created, a residual amount of photoresist often remains on the top of at least some of the microelectronic structures. In addition, some of this photoresist material often reacts with some of the gasses used in the metal etching process. It has been observed that at least some of the reacted photoresist material gets sputtered or removed from its original position and redeposited onto the side walls of the metal structures. In addition, during the metal etch process, the photoresist reacts with etch reactants and products to form "polymeric residue." Thus, after the completion of the metal etching step, many of the metal structures often exhibit polymeric residues on the side walls and some amount of photoresist remaining on top of the metallic structures.

Presently known fabrication techniques typically employ a two step process to remove the photoresist and the polymeric residue from the metal structures. More particularly, a plasma (e.g., oxygen plasma) step is typically employed to remove the photoresist. A second step, namely the removal of the polymeric residue, is typically accomplished in what is known as a wet stripping or wet strip process.

During the oxygen plasma step, the photoresist reacts with the oxygen (which is energized by the plasma) to form volatile compounds. However, some of the photoresist may remain on the substrate surface and become "hardened" as the photoresist reacts with the gases present in the plasma and other material present on the wafer surface. The hardened layer is then typically stripped from the substrate surface in a solvent solution, for example ACT 935, EKC 265, or other traditional wet strip solutions having a pH in the range of about 3 to 12. This wet strip process generally works very well in removing the polymeric residue and hardened photoresist, and is typically not problematic in the context of feature sizes on the order of one-half micron and greater. However, wet strip processes may, in addition to removing the polymeric residue and hardened photoresist, dissolve some of the metal features. If the features are large enough, this dissolution may not be problematic, but as the size of the metal features decreases, the metal dissolution may become increasingly troublesome.

Device structures employing feature sizes on the order of one-half micron and greater typically have extensions (also known as borders, dog bones, and landing pads) overlapping at least three sides of the underlying metal feature. For example, the metallic structure may extend over an underlying plug, (e.g., a tungsten plug). The extent to which a portion of the metal structure extends past the borders of the plug may vary from manufacturer to manufacturer, and may be driven by a number of design and process considerations. In effect, if the metal structure extends over the entire plug, the metal effectively isolates the plug from the wet strip medium. However, in feature sizes in the deep sub-half-micron region feature density and other design considerations often preclude the use of dog bone metal structures, essentially dictating that the metal layer overlie the underlying plug in borderless or unlanded (i.e., minimal or no extensions) relationship.

Due to various factors in the fabrication of device structures which are inherently difficult to control, such as the precise structural configuration of the metal structures, which result from the metal etch process, shrinkage and/or expansion of one or more of the metal structures and plugs, misalignment due to imperfections in the photo lithographic processes (e.g., deviations from perfect planarity), and the like, the metal structures may not always completely cover the plugs. As a result, some portion of a plug may be exposed to the wet strip solution, resulting in corrosion of the plug and/or metal structure, which corrosion may be electrochemically enhanced if the plug and overlying metallic structure are formed of different metals.

More particularly, if the electrochemical potential of the metallic structures is different from the electrochemical potential of their associated plugs, a corrosive environment may exist which can be modeled as a galvanic cell. Specifically, the metal structure and its underlying plug each function as an electrode, with the voltage bias between the two metals being a function of their respective (but different) electrode potentials. As a result of this electrovoltaic phenomenon, it has been observed that dissolution of the plugs or metal features may increase in the presence of the solvent, resulting in decreased volume of the plug and/or metal feature and, consequently, increased resistivity of the affected plugs and/or feature. The effect of this corrosion phenomenon on manufacturing throughput can be dramatic, resulting in upwards of 20% rejection rate for quarter micron device structures employing a wet strip process during manufacture. Moreover, even if these devices successfully complete resistivity and conductivity testing after manufacture, the devices may not function as desired or be reliable when subsequently used for their intended purpose.

Methods and apparatus are thus needed which facilitate the manufacture of deep sub-half-micron feature size devices, yet which mitigate the corrosive effects of presently known wet strip paradigms.

SUMMARY OF THE INVENTION

The present invention provides methods and apparatus which overcome many of the shortcomings associated with prior art photoresist and polymer stripping techniques.

In accordance with a preferred embodiment of the present invention, an advanced dry strip technique is employed which mitigates the corrosion problems associated with deep sub-micron line width devices formed on a substrate or workpiece surface. In accordance with one aspect of the invention, after metal etching, the photoresist is exposed to a water vapor environment at high temperature while avoiding exposure of the photoresist layer to an oxygen plasma environment. In this way, any residual chlorine which may remain on the workpiece surface after the metal etch step is substantially removed from the workpiece surface. Significantly, by exposing the photoresist to a water vapor environment in a substantially oxygen gas free medium, the photoresist and polymeric material do not become oxidized, which oxidation might result in resistance to subsequent dry-stripping processes.

In accordance with a further aspect of the present invention, after the workpiece has been exposed to the water vapor environment, the workpiece undergoes a dry strip process in the presence of a gas mixture. In a preferred embodiment, the gas mixture comprises a first gas (e.g., fluorine-containing gas such as $NF_3$ or $CF_4$) which reacts with the polymeric residue, making it water soluble. The gas mixture further comprises a second gas component which effectively reacts with the photoresist during the dry strip process to form a volatile compound. In a particularly preferred embodiment, a gas mixture comprising a fluorine containing component, oxygen gas, and argon gas is employed to simultaneously solubilize the polymeric residue, while also reacting with the photoresist to form volatile compounds. In accordance with a preferred aspect of this embodiment, a reactive ion etch process is employed to remove the polymeric residue and/or the photoresist.

In accordance with another embodiment of the present invention, a second dry strip process may be employed to substantially isotropically react with photoresist material to form volatile compounds and the polymeric residue to form soluble compounds. In accordance with an exemplary aspect of this embodiment, the workpiece is exposed to a remote plasma to which a mixture of fluorine-containing gas, oxygen gas, and argon gas are fed.

In accordance with a further aspect of the present invention, following the dry strip step the workpiece is rinsed with a solvent such as deionized (DI) water to remove the solubilized polymeric residue. In accordance with an exemplary embodiment of the present invention, the workpiece may be rinsed using a track system.

In accordance with a further aspect of the present invention, upon rinsing the solubilized polymeric residue from the workpiece, the workpiece is exposed to an oxygen plasma to ensure the removal of all or substantially all of the fluorine or halide compounds from the workpiece surface, thereby mitigating latent corrosion effects which could attack the metal structures over time. In accordance with a particularly preferred embodiment, this passivation step is performed at an elevated temperature of about 150° C.to 450° C.

These and other features, aspects, and advantages of the present invention are discussed more fully in the below detailed description, it being understood that the invention is not limited to the specific embodiments described herein; rather, the preferred embodiments discussed herein are merely exemplary applications of the subject invention, the scope of which is set forth in the claims appearing at the end of this document.

BRIEF DESCRIPTION OF THE DRAWING FIGURES

The subject invention will hereinafter be described in the context of the appended drawing figures, wherein like numerals denote like elements, and:

DETAILED DESCRIPTION OF PREFERRED EXEMPLARY EMBODIMENTS

Figure 5A:
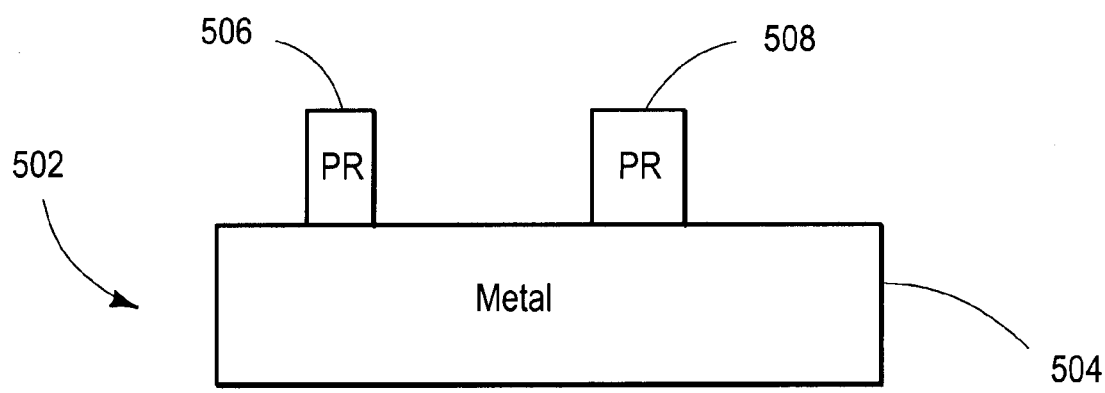
FIG. 5a is a schematic illustration of a photoresist pattern on a metal layer.

In accordance with a preferred embodiment of the present invention, an inventive dry strip process is employed in lieu of traditional wet strip processes for removing residual photoresist and polymeric residue from a workpiece or substrate surface following the metal etch process in the fabrication of a semiconductor device structure. More particularly and with reference to FIG. 5a, a portion 502 of a device structure is shown during fabrication. In particular, a photoresist pattern comprising respective photoresist structures 506 and 508 are disposed on top of metal layer 504. Those skilled in the art will appreciate that photoresist pattern structures 506 and 508 are suitably created using any convenient and well known exposure and developing processes. This printed photoresist pattern is typically transferred into the metal layer 504 during a metal etch process.

Figure 3:
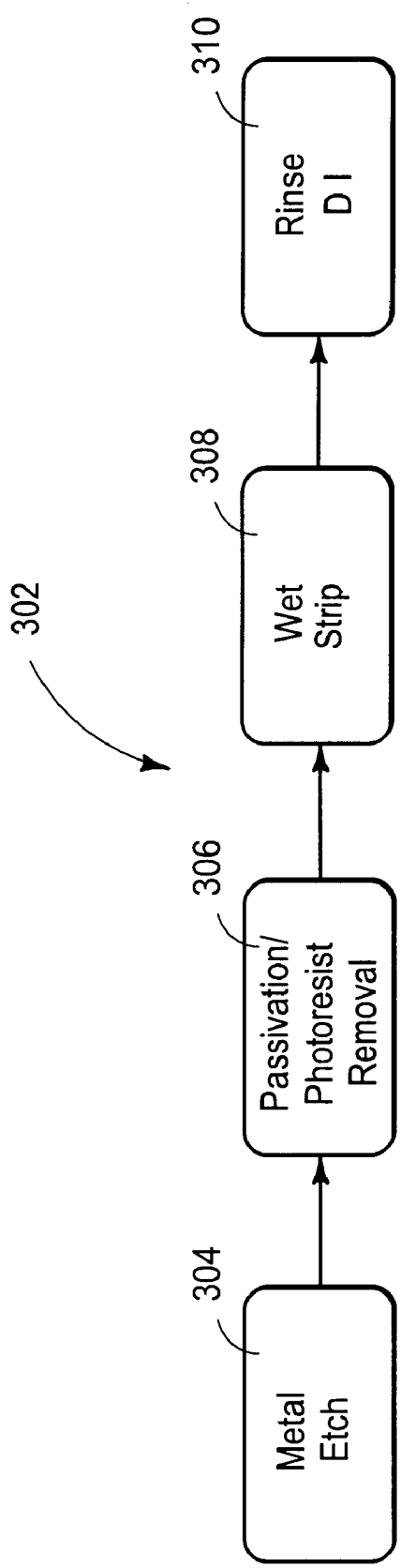
FIG. 3 is a schematic flow chart of prior art wet strip processes.
Figure 5B:
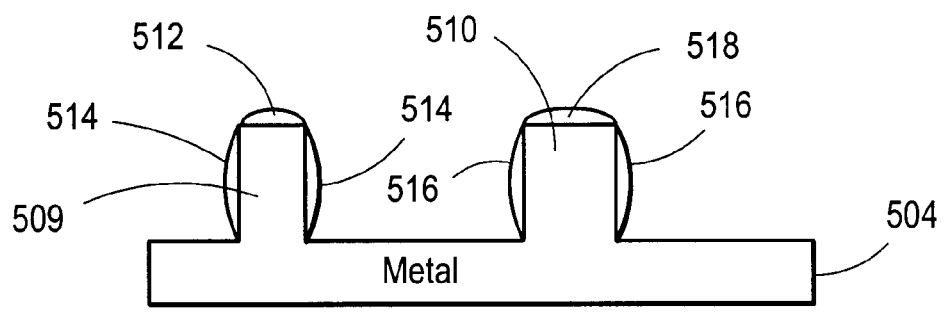
FIG. 5b is a schematic illustration of metal microelectronic structures corresponding to the photoresist pattern of FIG. 5a, illustrating residual photoresist on top of the metal structures and a polymeric residue on the side walls of the metal structures.

Referring now to FIGS. 3 and 5b, a traditional etch and stripping sequence 302 will now be described. In particular, during the metal etch process (step 304), the surface of metal layer 504 (e.g. formed of layers of TiN/Ti/AlCu/TiN/Ti) is etched away, except in the regions corresponding to the photoresist pattern (e.g., photoresist structures 506 and 508). Although virtually any etching chemistry that reacts with metal layer 504 to form volatile compounds may be employed, chlorine-based metal etching chemistries such as those including $BCl_3$, $Cl_2$, and the like, are most common.

The metal etch process results in the creation of metallic structures 509 and 510 corresponding to photoresist structures 506 and 508, respectively. As best seen in FIG. 5*b*, some amount of residual photoresist material often remains on top of the metal structures created during the metal etch process. In particular, it can be seen that a small amount of photoresist 512 remains on top of metal structure 509, and a quantity of residual photoresist 518 may remain on top of metal structure 510. In addition, the present inventors believe that some amount of photoresist material mixes with (e.g., reacts with) some of the chemicals employed in or resulting from the metal etch process, creating a polymeric residue that may become dislodged from structures 509, 510 and adhere to the side walls of the metal structures. Specifically, a piece of polymeric residue 514 is schematically illustrated along the vertical side walls of metal structures 509; similarly, a piece of polymeric residue 516 is shown along the side walls of metal structure 510.

In order to remove the residual photoresist, traditional processes typically employ a stripping procedure (step 306) to form volatile compounds with the photoresist. More particularly, prior art systems expose the workpiece, for example at a temperature in the range of 60 to 300° C.for a period on the order of 0.2 to 2.0 minutes to an oxygen plasma environment. During the stripping process (step 306), residual photoresist caps 512 and 518 undergo a reaction with the oxygen plasma to form volatile compounds that are removed from the workpiece surface during step 306. In the process, polymeric residue such as residues 514 and 516 become oxidized.

In order to remove the oxidized polymeric residue, prior art methods typically employ a wet strip process (step 308). In particular, wet strip solutions such as ACT 935, EKC 265, or other solutions having a pH on the order of about 3 to about 12 are employed to strip the oxidized polymeric residue from the workpiece surface. Upon completion of the wet strip process, the workpieces are typically rinsed, for example in deionized (DI) water to remove particulates and other chemicals.

For those microelectronic structures in which the metal stack and the underlying plug include different metals, corrosion of one or more of the stack or plug metals may occur or be enhanced when the metals are exposed to a wet strip solution. Moreover, as tighter design rules are employed and the size of borders for a metal stack with respect to an underlying plug are reduced, the potential for corrosion of one or more of the metals may increase.

Figure 1A:
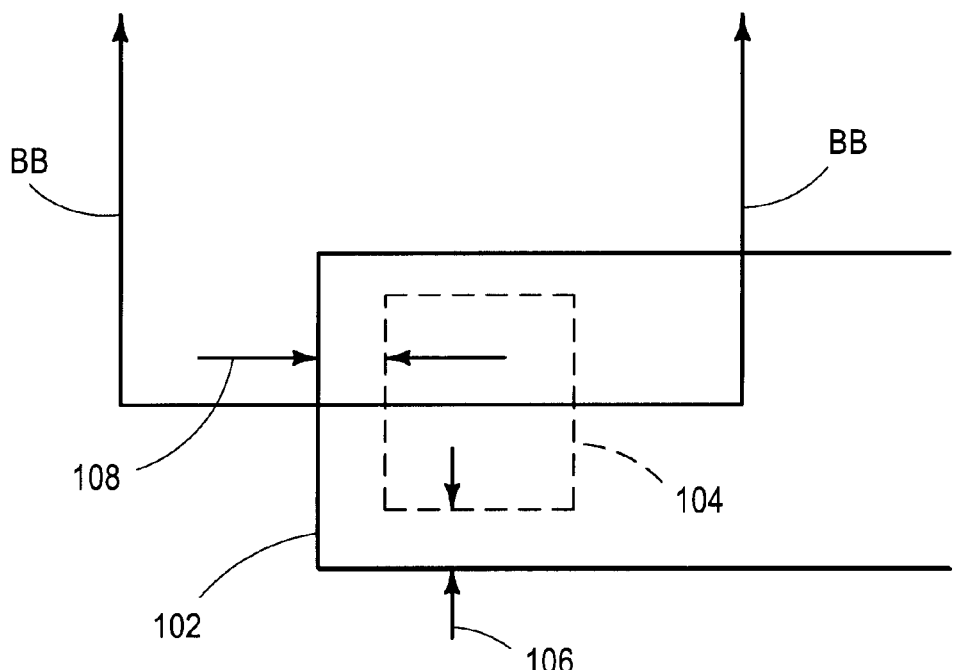
FIG. 1a is a schematic top view of a portion of a metal stack on top of an underlying plug, illustrating overlay.
Figure 1B:
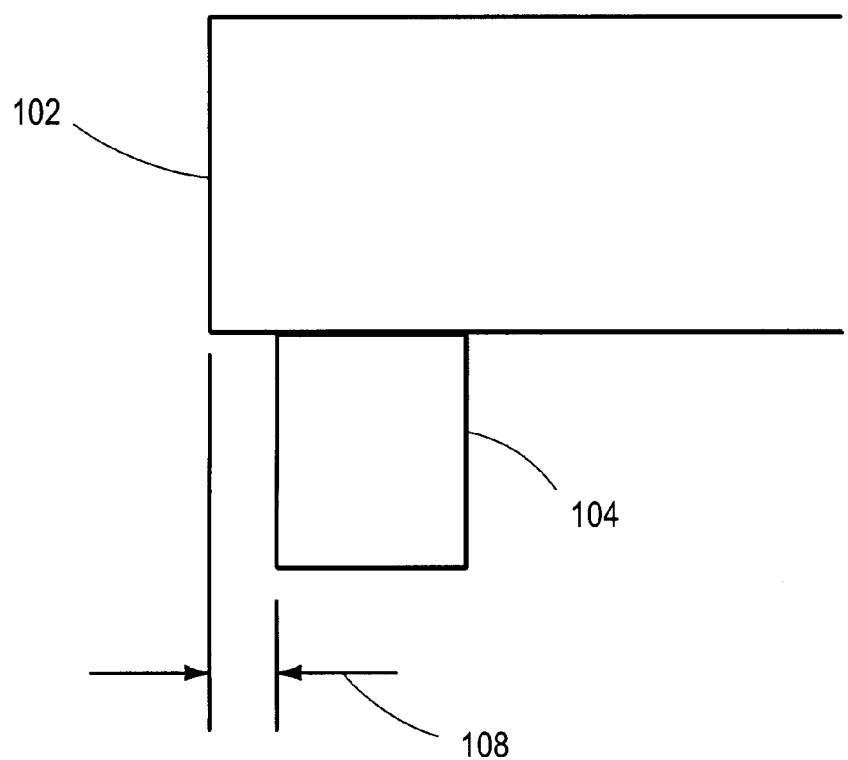
FIG. 1b is a schematic front view taken along line BB in FIG. 1a further illustrating a metallic microelectronic structure on top of its underlying plug exhibiting overlay.

More particularly and referring to FIG. 1*a* and 1*b*, a typical metal structure 102 having a border (also known as a dog bone, a landing pad, or an extension) relative to an underlying plug 104 is illustrated, as seen in the top view shown in FIG. 1*a*, as well as the front view shown in FIG. 1*b* (FIG. 1*b* is taken along the line BB in FIG. 1*a*). In particular, it can be seen that metal structure 102 extends beyond plug 104 by an amount 108 in the longitudinal direction and by an amount 106 in the lateral direction, forming a border about plug 104 on the top surface of plug 104. Those skilled in the art will appreciate that the size of the border is dictated by individual design and process considerations, but generally may be in the range of 50 to 500 nanometers. In order to conserve real estate and increase the density of microelectronic structures per square area, deep sub-half-micron and smaller feature sizes are often implemented with minimal or no borders.

Figure 2:
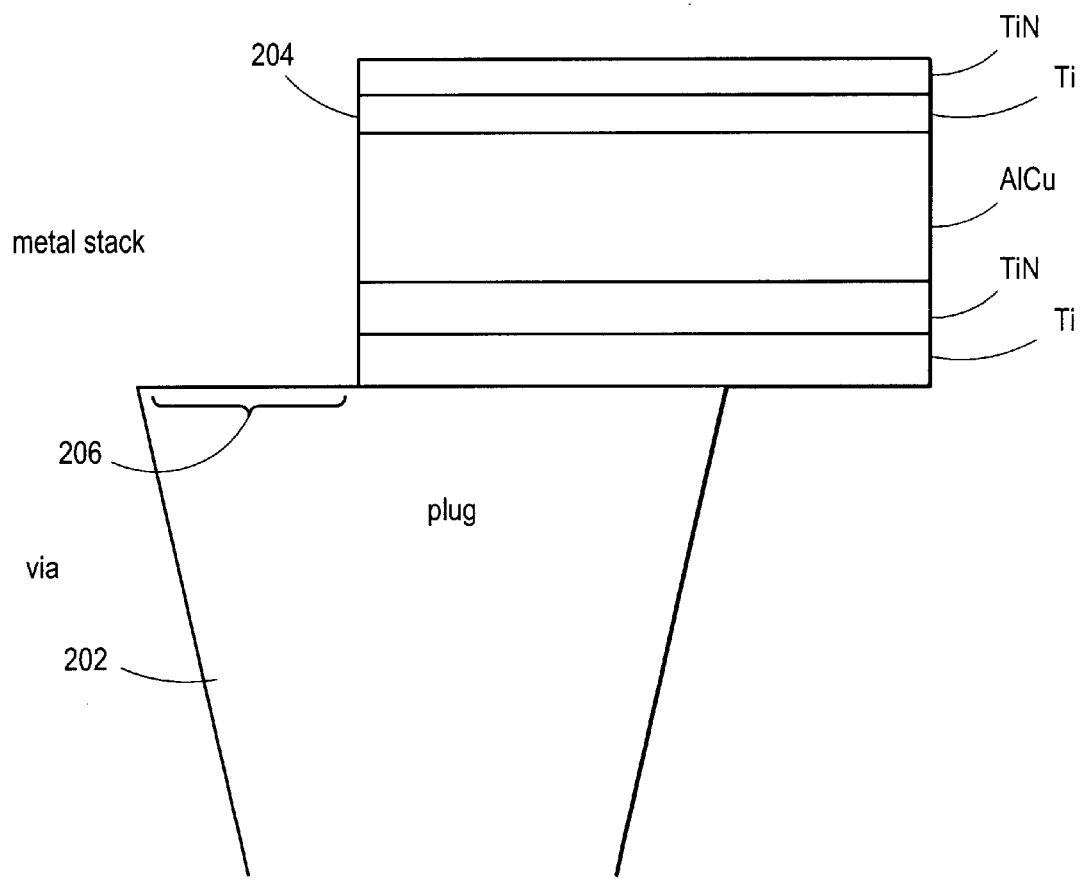
FIG. 2 is a schematic view of a portion of a metal structure on top of a plug, showing a portion of the plug exposed without overlay.

Referring now to FIG. 2, a portion of a metal structure 204 is shown on top of its underlying plug 202 (e.g., a tungsten plug). As discussed above, many factors may result in the plug being incompletely covered (unlanded) by metal structure 204, for example: expansion and shrinkage of the various parts due to thermal, chemical, and other factors; misalignment during the photolithographic and/or etching processes, and other factors. As a result, the exposed portion 206 of W-plug 202 may come into contact with the electrolyte-rich wet solution employed in prior art techniques, which may increase corrosion and/or dissolution of structure 204 or plug 202.

As also discussed above, the electrochemical potential for metallic structure 204 may be very different from that of plug 202. In addition, the electrochemical potential of various metals within structure 204 may differ. If structure 204, plug 202, or a combination thereof include metals of various electrochemical potentials, a voltage difference may be created between the various metals. The electrolyte-rich wet stripping solution is believed to enhance corrosion and/or dissolution of metals within structure 204 or plug 202. Moreover, the electrolyte solution dissolves products that form as a result of the galvanic cell enhanced corrosion. In other words, the combination of metal feature 204 and plug 202 in the presence of the electrolyte solution creates an environment that facilitates corrosion and dissolution of one or more metals forming either structure 204, plug 202, or both.

Figure 4:
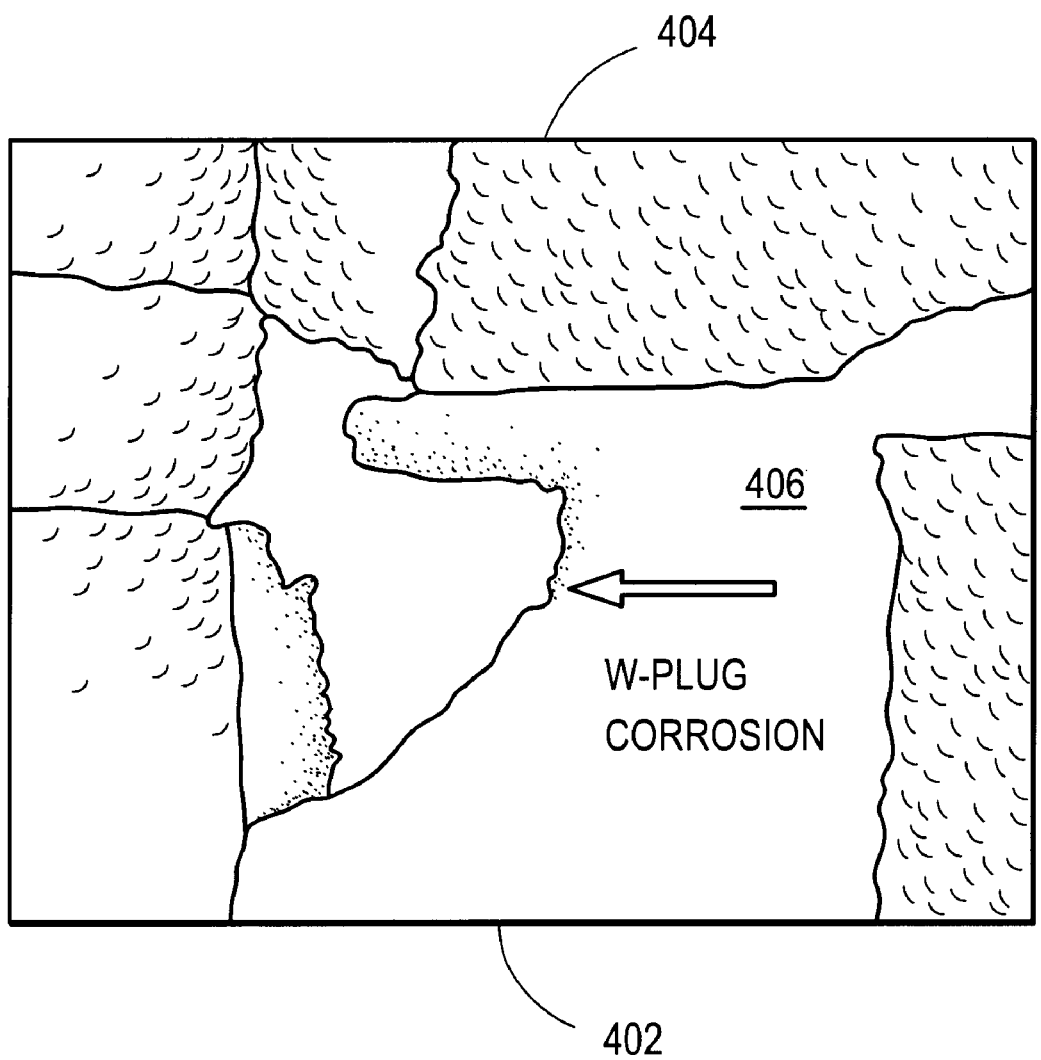
FIG. 4 is a micrograph showing corrosion of the plug shown in FIG. 2.

With momentary reference to FIG. 4, an electron micrograph illustrates a corrosion region 406 within an exemplary plug 402 as a result of the electrovoltaic interaction between plug 402 and metal structure 404.

In accordance with a preferred embodiment of the present invention, the foregoing shortcomings are addressed through the use of, inter alia, a passivation step which is substantially devoid of oxygen gas, followed by a dry strip process as described in greater detail below.

Figure 6:
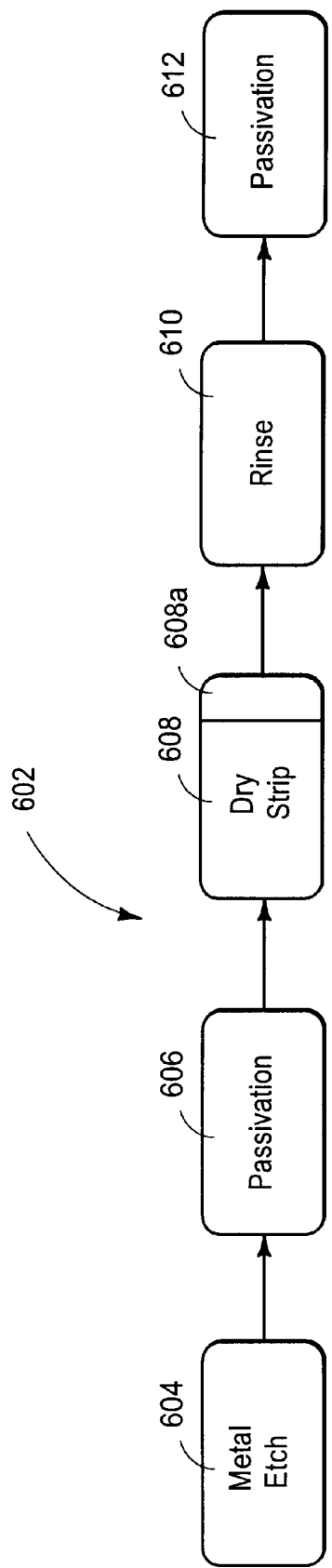
FIG. 6 is an exemplary flow chart of a dry strip process in accordance with the present invention.

Referring now to FIGS. 5*b* and 6 , following a conventional metal etch process (step 604), rather than exposing photoresist portions 512 and 518 to an oxygen plasma, metallic structures 509 and 510 are exposed to a water vapor environment (in a substantially oxygen gas free environment) (step 606). During the passivation step, the chlorine employed during the metal etch step and/or halide compounds on the workpiece surface are substantially or completely liberated from the workpiece surface. In accordance with a particularly preferred embodiment, passivation step 606 is performed at a temperature in the range of 250 to 350° C., for a period of 0.2 to 3 minutes in an environment essentially comprising water vapor and low pressure nitrogen. Significantly, by employing a gaseous environment during step 606 which is substantially free of oxygen gas, polymeric residue pieces 514 and 516 are either not significantly oxidized or not oxidized at all, which, in contrast to prior art techniques, renders the photoresist and polymeric residue susceptible to attack in a subsequent fluorine based stripping process, described below.

With continued reference to FIG. 5*b* and 6, either upon completion of passivation step 606 or near the end of step 606, a dry strip process is performed (step 608). More particularly, a stripping plasma is applied proximate the surface of the substrate surface, which plasma suitably includes at least a first gas component useful in rendering the polymeric residue soluble, and a second gas component capable of liberating the photoresist material. In accordance with a preferred embodiment, a dry strip plasma suitably includes on the order of 8% $NF_3$, 80% oxygen, and 12% argon. In addition, the dry strip process is suitably performed at a temperature in the range of 18–25° C. and at a pressure in the range of 0.1–0.3 torr, for a period on the order of 1–3 minutes. In accordance with a further exemplary embodiment of the present invention, a reactive ion etch (RIE) process operated at about 250 watts is employed to remove residual photoresist and polymeric residue.

During dry strip step 608, the fluorine component of the plasma reacts with the material comprising polymeric residues 514 and 516, rendering them soluble in subsequent processing steps. At the same time, the oxygen component of the dry strip plasma oxidizes the residual photoresist material to form volatile compounds that are liberated from the workpiece surface during step 608. By performing step 608 in a RIE reactor, the energy of ions hitting the substrate surface may be increased compared to conventional etch or remote plasma etch processes. This increased ion energy may assist removal of photoresist and polymeric residue.

Step 608 may also include an optional substep 608*a* that includes a process configured to substantially isotropically react with any remaining photoresist and polymeric residue. In accordance with an exemplary embodiment of the present invention, this process may be carried out with a remote plasma (e.g., a microwave plasma) including fluorine, oxygen, and argon gas components such as the gas mixture described above. In accordance with a further aspect of this embodiment, step 608*a* may be carried out in a ULVAC reactor (e.g. model Phoenix) at a power of about 1500 watts for a period of about 15–60 seconds at a temperature less than about 60° C.and preferably at about 18° C. to 25° C.

After completion of step 608, the metal structures are immediately rinsed (step 610) to prevent the fluorine that may remain on the structures from attacking the underlying metal structures 509 and 510 or other device components. In addition, the rinse, which is suitably performed using DI water, flushes away the now water soluble polymeric material 514 and 516. In a particularly preferred embodiment, rinse step 610 is performed while spinning substrates on a rinse track for example in the range of 200 to 4,000 rpm, and most preferably about 800 rpm, for in the range of 10 seconds to 5 minutes, and most preferably around 2 minutes. However, step 608 may also suitably be performed using a spin-rinse dryer, a spray acid tool, a rinse tank, or the like.

In accordance with a further aspect of the present invention, upon completion of rinse step 610, it may be desirable to passivate (step 612) the metal structures to ensure that all of the fluorine or other halide compounds are removed from the substrate surface. This mitigates possible corrosion or dissolution which might otherwise occur over time if residual fluorine is allowed to remain on the surface of the metal structures. More particularly, passivation step 612 is suitably carried out in an oxygen plasma, preferably at an elevated temperature in the range of 280 to 350° C.

The foregoing description is of preferred embodiments of the subject invention. It will be appreciated that the foregoing description is not intended to be limiting; rather, the preferred embodiments set forth herein merely set forth exemplary applications of the subject invention. It will be appreciated that various changes, deletions, and additions may be made to the components and steps discussed herein, without departing from the spirit and scope of the invention as set forth in the appended claims. For example, all of the stripping plasma of the present invention was described as comprising fluorine-based gasses, oxygen, and argon; other components may be employed for the same purposes. Moreover, fluorine-based gasses, oxygen, and argon may be used alone or in combination. In addition, although the process has been described as a "dry etch" process, it may be possible to implement the subject invention, i.e., stripping away the photoresist and the polymeric residue from the etched metal structures, even in a wet environment, using chemistries which mitigate the corrosive effects of presently known wet strip solutions.

What is claimed is:

1. A method for removing residual photoresist and polymeric residue from a substrate surface following metal etching during manufacture of a semiconductor device, the method comprising the steps of:

stripping said device in a strip medium having a first component which renders said polymeric residue water soluble; and rinsing said water soluble polymeric residue from the device.

2. The method of claim 1, wherein said strip medium further comprises a second component for effecting formation of volatile compounds of said residual photoresist during said stripping step.

3. The method of claim 2, further comprising the step of passivating said substrate following said rinsing step.

4. The method of claim 3, further comprising the step of rinsing said device following said passivation step.

5. The method of claim 1, wherein said rinsing step comprises rinsing said substrate in deionized water.

6. The method of claim 3, wherein said passivation step comprises applying a plasma comprising oxygen proximate said substrate.

7. The method of claim 1, wherein said stripping step comprises applying a fluorine based plasma proximate said substrate.

8. The method of claim 7, wherein said strip medium comprises $NF_3$, oxygen, and argon.

9. The method of claim 1, further comprising the step of exposing said substrate proximate a remote plasma containing $NF_3$, oxygen, and argon.

* * * * *